US007696682B2

(12) United States Patent
Kim et al.

(10) Patent No.: US 7,696,682 B2
(45) Date of Patent: Apr. 13, 2010

(54) ORGANIC LIGHT EMITTING DEVICE USING MG—AG THIN FILM AND MANUFACTURING METHOD THEREOF

(75) Inventors: Tae-Whan Kim, Seoul (KR);
Dong-Chul Choo, Seoul (KR);
Hee-Cheol Im, Seoul (KR)

(73) Assignee: Samsung Electronics Co., Ltd. (KR)

( * ) Notice: Subject to any disclaimer, the term of this patent is extended or adjusted under 35 U.S.C. 154(b) by 661 days.

(21) Appl. No.: 11/475,791

(22) Filed: Jun. 27, 2006

(65) Prior Publication Data

US 2006/0290270 A1 Dec. 28, 2006

(30) Foreign Application Priority Data

Jun. 27, 2005 (KR) ............... 10-2005-0055852

(51) Int. Cl.
*H01J 1/62* (2006.01)
(52) U.S. Cl. .................. 313/503; 313/506; 313/504
(58) Field of Classification Search .......... 313/498–512
See application file for complete search history.

(56) References Cited

U.S. PATENT DOCUMENTS

| 2002/0101154 A1* | 8/2002 | Seo et al. ............. 313/506 |
| 2004/0090175 A1* | 5/2004 | Urabe et al. .......... 313/504 |
| 2005/0046337 A1* | 3/2005 | Chin et al. ........... 313/504 |
| 2005/0208330 A1* | 9/2005 | Raychaudhuri et al. ..... 428/690 |
| 2005/0260440 A1* | 11/2005 | Seo et al. ............. 428/690 |
| 2007/0194692 A1* | 8/2007 | Nomura et al. ........ 313/503 |

FOREIGN PATENT DOCUMENTS

| JP | 09-097676 | * | 8/1997 |
| KR | 1019980081742 | | 11/1998 |
| KR | 1020030038441 | | 5/2003 |
| WO | WO2004/054326 | * | 6/2004 |
| WO | WO2005/062678 | * | 7/2005 |

OTHER PUBLICATIONS

"Bright Organic Electroluminescent Devices with Double-Layer Cathode", Kido et al., IEEE Transcations on Electron Devices vol. 40, No. 7 Jul. 1993.*
"Organic Electroluminescent Diodes"; Authors: C.W. Tang and S.A. VanSlyke; Appl Phys Lett. 51 (12); Sep. 1987, pp. 913-915.
"Carrier Tunneling and Device Characteristics in Polymer Light-Emitting Diodes"; Author: I.D. Parker; J. Appl. Phys 75(3), Feb. 1, 1994; pp. 1656-1666.

* cited by examiner

*Primary Examiner*—Joseph L Williams
(74) *Attorney, Agent, or Firm*—Cantor Colburn LLP

(57) ABSTRACT

An organic light emitting device according to embodiment of the present invention comprises: a substrate; a first electrode formed on the substrate; a light-emitting member formed on the first electrode, and comprising multi-layer structure; and a second electrode formed on the light-emitting member, wherein the second electrode comprises Mg—Ag alloy which contains Mg of 1-10 wt % and a concentration gradient of the Mg—Ag alloy is formed from the top of the emitting-light member.

8 Claims, 3 Drawing Sheets

ORGANIC LIGHT EMITTING DEVICE USING MG—AG THIN FILM AND MANUFACTURING METHOD THEREOF

This application claims priority to Korean Patent Application No. 10-2005-0055852 filed on Jun. 27, 2005, and all the benefits accruing therefrom under 35 U.S.C. §119, the entire contents of which are incorporated herein by reference.

BACKGROUND OF THE INVENTION (a) Field of the Invention

The present invention relates to an organic light emitting device and manufacturing method therefore.

(b) Description of the Related Art

As display devices have been getting larger, a flat panel display device that takes up little space is increasingly required. An organic light emitting device, one of the flat panel display devices, is being rapidly developed.

The organic light emitting device has an organic thin film sandwiched between two opposing electrodes and is a multi-layered structure using different materials in order to enhance efficiency and stability. An organic light-emitting device includes an anode, a hole injection layer into which holes are injected from the anode, a hole transport layer for transporting holes, an emission layer for combining holes with electrons, an electron transport layer for transporting electrons, and a cathode. If holes and electrons generated from the anode having a high work function and the cathode having a low work function, respectively, are injected into the emission layer through the hole injection layer/hole transport layer and the electron injection layer/electron transport layer, excitons are generated within the emission layer. When the excitons are extinguished, light corresponding to energy thereof is generated and emitted.

In the development of a high-efficiency organic light emitting device, a technology for injecting electrons from the cathode and for injecting holes from the anode to the emitting layer without generation of an energy barrier is of importance.

Magnesium (Mg), which has a low work function of 3.6 electron volts (eV), is used to reduce the energy barrier that is an issue when electrons are injected from a metal electrode to an organic compound that is known as an electrical insulator. Since Mg is easily oxidized, is unstable and has poor surface cohesion to organic materials, silver (Ag), which is relatively stable and has a high work function and good cohesion to a surface of organic materials, is alloyed with Mg (hereinafter, referred to as "Mg—Ag") for use (Tang et al., Appl. Phys. Lett. 51, 913 1987).

Further, a research group of Toppan Printing Company (51st periodical meeting, The Japan Society of Applied Physics, Preprint 28a-PB-4, p.1040) discovered that, if lithium (Li) (work function of 2.9 eV), being an alkali metal and having a lower work function than Mg, is alloyed with aluminum (Al) (work function of 4.2 eV) to form a stable electron injection cathode, a lower driving voltage and a higher light emitting brightness than that of an organic light emitting device using a Mg alloy can be obtained.

In order to further improve device efficiency and lifetime, the electrode layer can be formed of a mixture material or an additional functional layer can be introduced. Until now, two steps of depositing a Mg—Ag alloy thin film having a Mg/Ag weight percentage of 7:3 (ratio of 10 to 1 in terms of atomic ratio) and then depositing a Ag thin film have generally been performed, or an Al thin film has been used as a cathode and a LiF buffer layer has been deposited to be used together.

However, these methods have a drawback in that, as a plurality of thin films are used, a phenomenon of electron trapping occurring between the thin films or occurrence of interface roughness between heterogeneous materials causes electron mobility to be reduced and an electron injection effect to be deteriorated.

BRIEF SUMMARY OF THE INVENTION

An exemplary embodiment of an organic light-emitting device includes a substrate, a first electrode formed on the substrate; a light-emitting member formed on the first electrode, and a second electrode formed on the light-emitting member. The light-emitting member includes a multi-layer structure. The second electrode includes Mg—Ag alloy which contains Mg of about 1-10 wt %. A concentration gradient of the Mg—Ag alloy is formed at an interface of the Mg—Ag alloy and the light-emitting member.

An exemplary embodiment of a method of manufacturing an organic light emitting display includes forming a first electrode on a substrate, forming a light-emitting member on the first electrode and forming a second electrode on the light-emitting member. The forming a second electrode includes depositing an Mg—Ag alloy onto the light-emitting member and forming a concentration gradient of Mg and Ag at the interface with the light-emitting member, the Mg—Ag alloy including Mg and Ag, the Mg being about 1 to 10 wt %.

In an exemplary embodiment, a display device includes an organic light-emitting device. The organic light-emitting device includes a substrate, a first electrode disposed on the substrate, an organic layer disposed on the first electrode, the organic layer having a multi-layer structure, a second electrode disposed on the organic layer and a concentration gradient of the Mg—Ag alloy at an interface of the Mg—Ag alloy and the organic layer. The second electrode includes Mg—Ag alloy including 5 wt % Mg. A concentration of the Mg is highest at the interface and is gradually lower at distances away from the interface.

DETAILED DESCRIPTION OF THE INVENTION

Figure 1:
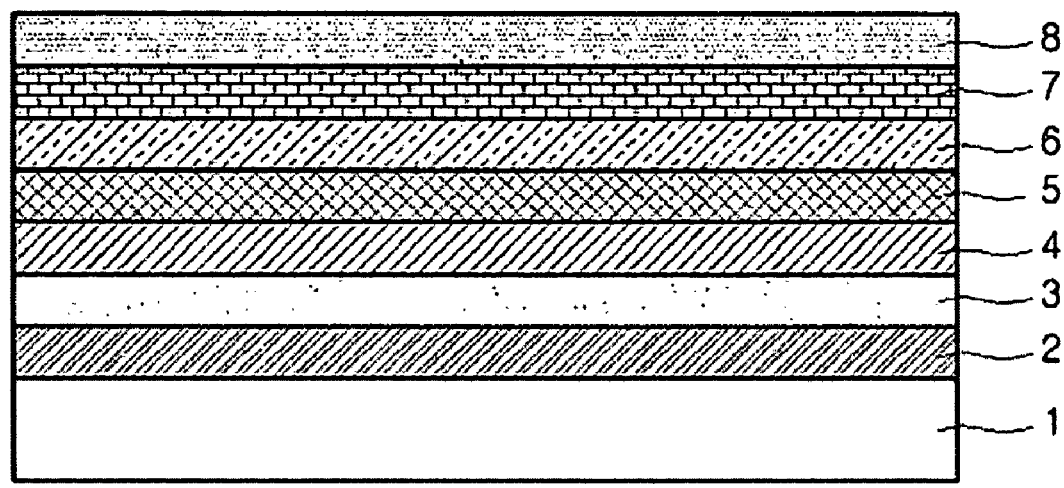
FIG. 1 is a cross-sectional view illustrating an exemplary embodiment of a structure of a multi-layered organic light-emitting device.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout. As used herein, the term "and/or" includes any and all combinations of one or more of the associated listed items.

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An exemplary embodiment of the present invention will hereinafter be described in detail with reference to the accompanying drawings.

FIG. 1 is a cross-sectional view illustrating an exemplary embodiment of a multi-layered organic light emitting device (OLED). The OLED includes a substrate 1, a first electrode 2, a hole injection layer 3, a hole transport layer 4, an organic emission layer 5, an electron transport layer 6, an electron injection layer 7, and a second electrode 8.

When a driving voltage is applied to the first electrode 2 and the second electrode 8, holes of the hole injection layer 3 and electrons of the electron injection layer 7 travel toward and are introduced into the emission layer 5, respectively. The first electrode 2 may be a transparent anode. As the electrons and the holes are introduced into the organic emission layer 5, excitons are generated. The generated exitons drop from an excited state to a ground state, thereby generating visible light by an energy difference. The visible light generated from the emission layer 5 exits through a transparent anode 2, thereby displaying images.

The second electrode (cathode) 8 includes metals having a small work function, such as calcium (Ca), magnesium (Mg) and aluminum (Al). Metals having a small work function are employed in the cathode 8 because a barrier provided between the electrode 8 and the organic emission layer 5 is lowered, thereby obtaining a high current density in electron injection.

In exemplary embodiments, a cathode may include a Mg—Ag/Ag or Al/LiF double thin film. In the double Mg—Ag/Ag thin film, Mg atoms having a work function of 3.7 eV are used for electron injection, and Ag atoms having a work function of 4.6 eV are used to reduce resistance between the alloy thin film and the electrode. In alternative exemplary embodiments where the Mg—Ag alloy thin film having a weight ratio of Mg to Ag of about 7:3 is deposited in an interface of a metal and an organic material and then a Ag thick film is deposited, an electrode (cathode) having a low electron injection barrier and good adhesion can be manufactured, but the process may be relatively complex.

Where an Al thin film is used as the cathode, a LiF buffer layer is deposited and used together as described above. If the Al/LiF electrode is used, the electron injection efficiency of an organic layer is deteriorated since the Al atoms have a high work function of 4.2 eV. LiF is thinly grown between the Al atoms and the organic material and generates dipole energy, thereby reducing the electron injection barrier.

A cathode manufacturing method using the two processes may be relatively complex, and due to an electron trap phenomenon in the interface between the Mg/Ag thin film and the Ag thin film and interface roughness occurring between heterogeneous materials of an interface between the Ag thin film and the LiF thin film, electron mobility may be reduced, thereby deteriorating an electron injection effect.

In an exemplary embodiment of the present invention, inventors form a new cathode using a single Mg—Ag alloy thin film formed of Mg and Ag and having Mg based on five weight percentages (Mg/Ag of 5/95), and manufacture an organic light emitting device using the cathode therein.

Figure 2:
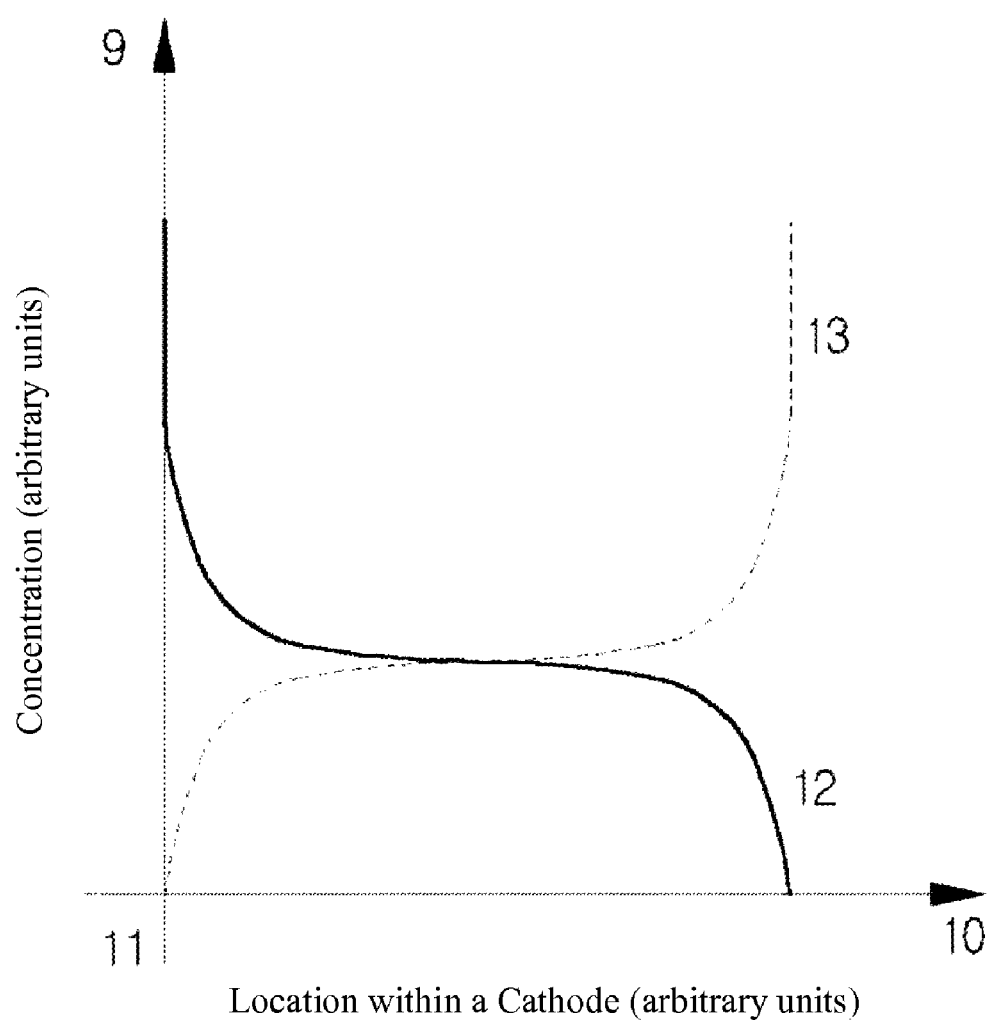
FIG. 2 is a schematic diagram illustrating an exemplary embodiment of a distribution of Mg and Ag within a cathode having a single Mg and Ag alloy thin film according to the present invention.

FIG. 2 is a graph comparatively illustrating a distribution of Mg and Ag within a cathode having the single Mg and Ag alloy thin film. In FIG. 2, reference numeral "9" denotes an axis showing a depth variation of the Mg—Ag alloy thin film, reference numeral "10" denotes an axis showing concentration variations of Mg atoms and Ag atoms in the single Mg—Ag alloy thin film (where concentrations increase in the direction of the axis 10 arrow, or to the right), reference numeral "11" denotes an interface between the Mg—Ag alloy thin film and an organic layer, reference numeral "12" (darkened curve) denotes a concentration variation of Mg based on a depth of the single Mg—Ag alloy thin film, and reference numeral "13" denotes a concentration variation of Ag based on a depth of the single Mg—Ag alloy thin film.

Where the Mg—Ag thin film interfaces with the organic layer (reference numeral 11), essentially where the depth variation (on axis 9) is the smallest, the concentration of Mg (curve 12) in the Mg—Ag alloy film is the highest. The concentration of Mg in the Mg—Ag alloy decreases (curve 12) as a distance (or depth) from the interface of the Mg—Ag alloy film and the organic layer (11) increases, where depth increase is indicated in the direction of the axis 9 arrow, or vertically upwards.

In the exemplary embodiment of the cathode using the Mg—Ag single thin film having Mg based on five weight percentages and manufactured according to the method of the present invention, an effect is observed in that a difference between boiling points of Mg and Ag is used to increase a percentage of Mg atoms near an interface between the organic layer and the metal cathode, thereby decreasing an electron injection barrier. Also, in other than an interface region, a percentage of Ag atoms is increased, thereby reducing resistance between a current application electrode and a surface region of the thin film containing many Ag atoms.

In another exemplary embodiment, a manufacturing method of an organic light emitting device including the illustrated exemplary embodiment of cathode forming method is provided.

The organic light emitting device can be manufactured to have various structures such as an anode/emission layer/cathode structure, an anode/hole transport layer/emission layer/electron transport layer/cathode structure, or an anode/hole injection layer/hole transport layer/emission layer/electron transport layer/electron injection layer/cathode structure.

Referring again to FIG. 1, the first electrode (anode) 2 is an electrode for hole injection, and may employ a transparent metal oxide having a high work function and allows emission of light from a device. In exemplary embodiments the hole injection electrode material includes indium tin oxide (ITO) in a thickness of about 150 nanometers (nm).

In exemplary embodiments, the hole injection layer 3 may be formed of copper (II) Phthalocyanine through deposition to have a thickness of about 10 to 30 nm and the hole transport layer 4 may be formed of N,N-diphenyl-N,N'-bis(3-methyphenyl)-(1,1'-biphenyl)-4,4'-diamine (TPD) or 4,4'-bis[N-(1-naphthyl)-N-phenyl-amino]biphenyl (NPD) to have a thickness of about 30 to 60 nm.

The emission layer 5 is a layer for emitting light when exitons formed through a combination of holes and electrons injected respectively in the first electrode 2 and the second electrode 8 drop to the ground state. In exemplary embodiments, the emission layer 5 may include, but is not limited to, a low molecular organic material such as $Alq_3$ and DPVBi (4,4-Bis(2,2-diphenyl-ethen-1-yl)-bipheyl), or a polymer organic material such as PPV (poly(p-phenylenevinylene)), PT (polythiophene), and derivatives thereof.

In exemplary embodiments, the electron transport layer 6 may include, but is not limited to, an alkyl metal complex compound such as $Alq_3$ that is deposited to a thickness of about 20 to 50 nm. The electron injection layer 7 improves performance of electron injection. In exemplary embodiments, the electron injection layer 7 may be created by forming LiF or $Li_2O$ at a thickness of about 5 Å or by forming an alkali metal such as lithium (Li), calcium (Ca), magnesium (Mg), and strontium (Sr), or alkali earth metal, at a thickness of about 100 Å.

As in the illustrated exemplary embodiment described above, the second electrode (cathode) 8 having a single thin film is formed by depositing a Mg—Ag alloy to an organic layer. The Mg—Ag alloy may include about 1 wt % to about 10 wt % Mg.

In another exemplary embodiment of the present invention, an organic light emitting device manufactured by the manufacturing method is disclosed.

Figure 3:
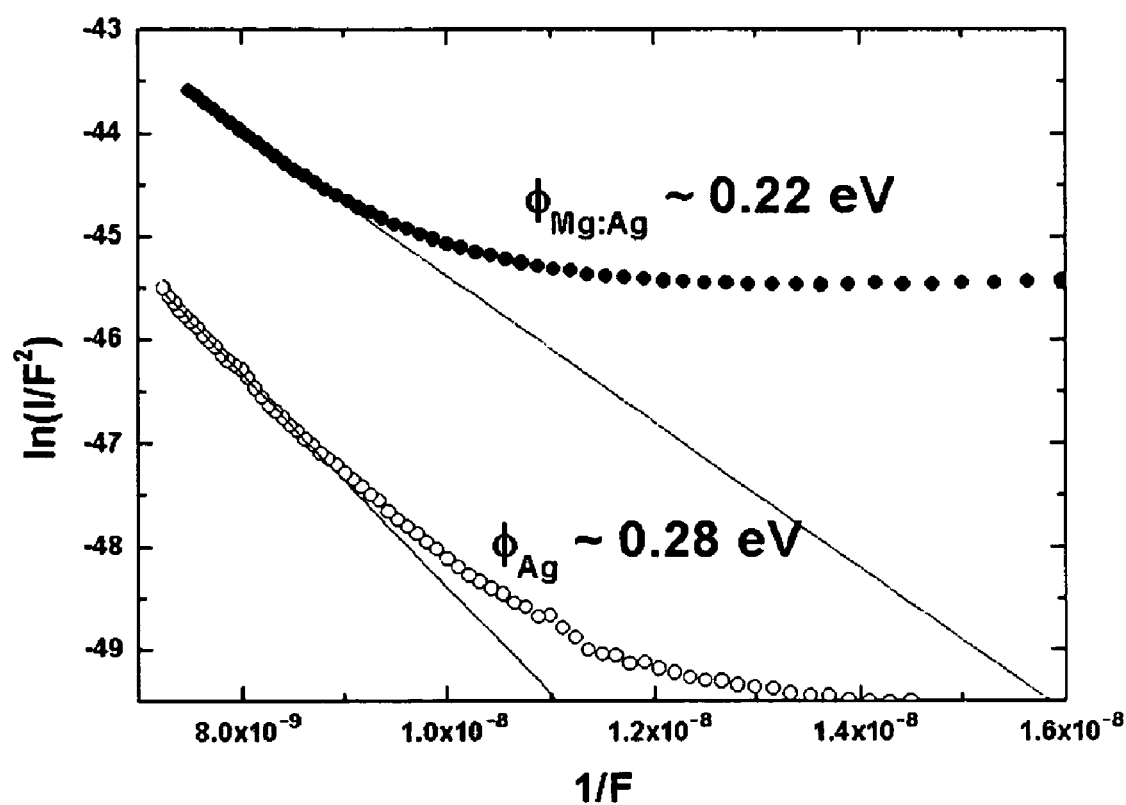
FIG. 3 is a graph illustrating an exemplary embodiment of a variation amount of $\ln(I/F^2)$ based on an inverse of a force of an electric field (F) calculated from current-voltage variation measurements and a size of an electron injection barrier, to examine an electron injection effect of an organic light emitting device according to the present invention.

FIG. 3 is a graph illustrating an exemplary embodiment of a variation amount of ln (I/F$^2$) based on an inverse of a force of an electric field (F) calculated from current-voltage variation measurement, and a size of an electron injection barrier, to examine an electron injection effect of an organic light emitting device according to the present invention. Examination is performed for electron injection characteristics in cases where, as the cathode, the Mg—Ag single thin film is used and the Ag thin film (first comparative example) is used. As a result of calculating an energy barrier of electrons from the above characteristics, Mg—Ag/$Alq_3$ is shown to have an energy barrier of 0.22 eV and Ag/$Alq_3$ has an energy barrier of 0.28 eV. The Mg—Ag single thin film is well formed in the heterogeneous interface between the organic layer and the metal, and a charge injection barrier is lowered, thereby efficiently injecting electrons in comparison to the organic light emitting device having the Ag electrode.

EXAMPLE 1

Manufacture of the Organic Light Emitting Device Having the Cathode Using the Mg and Ag Single Thin Film Forming the Anode and the Hole Transport Layer A glass substrate on which an indium-tin-oxide thin film was grown and having a surface resistance of 30 Ω/□(=Ohm/sq) was deposited in an organic molecular-beam depositor. Next, a vacuum degree (pressure) of about $10^{-7}$-$10^{-9}$ Torr was maintained while naphthylphenylbiphenyl diamine NPB was vacuum deposited to have a thickness of about 40 nm. A growing speed was kept at about 0.1 nm/second, thereby growing a high-quality thin film.

Forming of the emission layer and the electron transport layer $Alq_3$ (green emission layer and electron transport layer material) was vacuum deposited to have a thickness of about 60 nm on the hole transport layer, thereby forming the emission layer. When the emission layer was deposited, substantially the same vacuum degree and growing speed as when the hole transport layer was deposited were maintained.

Forming the Cathode

A sample in which the organic material of the hole transport layer, the emission layer, and the electron transport layer were deposited was moved to a metal vacuum depositor for maintaining a vacuum degree of about $10^{-6}$ Torr. An Mg—Ag alloy source having Mg based on five weight % was thermally deposited. The deposition speed was about 1 nm/second, and the total deposited thickness was about 100 nm to 150 nm.

FIRST COMPARATIVE EXAMPLE

Manufacture of the Organic Light Emitting Device Having the Ag Cathode

Under all the same conditions other than the use of the Ag thin film when the cathode was formed in Example 1, an organic light emitting device was manufactured.

FIRST TEST EXAMPLE

Measurement of an Electron Injection Efficiency of the Organic Light Emitting Device Manufactured in the Exemplary Embodiment and the Comparative Example In order to compare the electron injection efficiency of the device manufactured in Example 1 and the First Comparative Example, a device in which the anode employed aluminum that has a large work function and in which the hole transport layer was not provided was manufactured. This device was an electron-only device in which most currents were formed by electrons since the hole injection barrier was so large in comparison to the electron injection barrier.

I. D. Parker's (J. Appl. Phys. 75, 1656 1994) experimental results showed that the electron and hole injection barriers can be measured using an asymmetric device. In order to measure the current-voltage characteristic of the manufactured electron-only device and calculate a height of a tunneling barrier from the measured current-voltage characteristic, as shown in FIG. 3, a log relationship of an inverse of an electric field and a square of current for the electric field are used. Approximating a slope of a high electric field region using a principle of forming a tunneling current at a high electric field in the graph, it was shown that barrier heights were 0.22 eV and 0.28 eV, respectively, in the case where the Mg—Ag electrode was used and the Ag electrode was used. This result shows that Mg effectively reduces the electron injection barrier when the Mg—Ag thin film having Mg at five weight % was used.

In the illustrated exemplary embodiment, the method for forming the cathode through one deposition process, using the Mg—Ag alloy thin film having Mg at five weight %, can simplify the manufacturing process of the organic light emitting device and also produce the high-efficient electron injection effect in the manufactured organic light emitting device, and therefore it can be useful.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
    a substrate;
    a first electrode formed on the substrate;
    a light-emitting member formed on the first electrode, and comprising a multi-layer structure; and
    a second electrode formed on the light-emitting member,
    wherein the second electrode consists of an Mg—Ag alloy, which contains about 1 wt % to about 10 wt % Mg and has a concentration gradient.

2. The organic light emitting device of claim 1, wherein a Mg concentration in the Mg—Ag alloy is highest at a surface of the second electrode contacting the light-emitting member and is gradually lower from the surface of the second electrode.

3. The organic light emitting device of claim 2, wherein the Mg—Ag alloy comprises about 5 wt % Mg.

4. A method of manufacturing an organic light emitting display, the method comprising:
    forming a first electrode on a substrate;
    forming a light-emitting member on the first electrode; and
    forming a second electrode on the light-emitting member,
    wherein the forming of the second electrode comprises depositing an Mg—Ag alloy onto the light-emitting member and forming a concentration gradient of Mg and Ag in the Mg—Ag alloy, which consists of Ag and about 1 wt % to about 10 wt % Mg.

5. The method of claim 4, wherein the Mg—Ag alloy has Mg at about 5 wt %.

6. The method of claim 4, wherein a Mg concentration in the Mg—Ag alloy is highest at a surface of the second electrode contacting the light-emitting member and is gradually lower from the surface of the second electrode.

7. A display device comprising:
    an organic light emitting device comprising:
        a substrate;
        a first electrode disposed on the substrate;
        an organic layer disposed on the first electrode, the organic layer having a multi-layer structure;
        a second electrode disposed on the organic layer, wherein the second electrode consists of an Mg—Ag alloy, which contains about 1 wt % to about 10 wt % Mg and has a concentration gradient, and
    wherein a concentration of Mg is highest at an interface of the second electrode and the organic layer and is gradually lower at distances away from the interface.

8. The display device of according to claim 7, wherein the Mg—Ag alloy consists of Ag and about 5 wt % Mg.

* * * * *

UNITED STATES PATENT AND TRADEMARK OFFICE
CERTIFICATE OF CORRECTION

PATENT NO. : 7,696,682 B2  Page 1 of 1
APPLICATION NO. : 11/475791
DATED : April 13, 2010
INVENTOR(S) : Tae-Whan Kim et al.

It is certified that error appears in the above-identified patent and that said Letters Patent is hereby corrected as shown below:

| Error Location in Issued Patent | | Description of Error and Correction |
|---|---|---|
| Column | Line | |
| Title Page | Item (73), Assignee | Insert "Industry-University Cooperation Foundation, Hanyang University (KR)" after "Samsung Electronics Co., Ltd. (KR)" |

Signed and Sealed this

Thirteenth Day of July, 2010

David J. Kappos
*Director of the United States Patent and Trademark Office*